(12) United States Patent
Takada et al.

(10) Patent No.: US 8,461,940 B2
(45) Date of Patent: Jun. 11, 2013

(54) ELASTIC WAVE DEVICE AND METHOD FOR MANUFACTURING THE SAME

(75) Inventors: Norihiko Takada, Kanazawa (JP); Atsushi Kadoi, Moriyama (JP); Hayami Kudo, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 287 days.

(21) Appl. No.: 12/850,725

(22) Filed: Aug. 5, 2010

(65) Prior Publication Data

US 2010/0289600 A1 Nov. 18, 2010

Related U.S. Application Data

(63) Continuation of application No. PCT/JP2009/050666, filed on Jan. 19, 2009.

(30) Foreign Application Priority Data

Feb. 18, 2008 (JP) ................................. 2008-036396

(51) Int. Cl.
*H03H 9/00* (2006.01)
*H03H 9/15* (2006.01)
*H03H 9/25* (2006.01)

(52) U.S. Cl.
USPC ............................ 333/186; 333/187; 333/193

(58) Field of Classification Search
USPC ......................................... 333/187–196, 186
See application file for complete search history.

(56) References Cited

U.S. PATENT DOCUMENTS

| 4,642,508 | A  |   | 2/1987  | Suzuki et al.                |
|-----------|----|---|---------|------------------------------|
| 5,920,142 | A  | * | 7/1999  | Onishi et al. ....... 310/313 R |
| 6,995,634 | B2 | * | 2/2006  | Iwashita et al. ....... 333/193 |
| 7,282,323 | B2 | * | 10/2007 | Kanatani et al. ....... 430/281.1 |
| 7,583,161 | B2 | * | 9/2009  | Tanaka ................. 333/133 |

(Continued)

FOREIGN PATENT DOCUMENTS

| CN | 1383611 A | 12/2002 |
|----|-----------|---------|
| CN | 1579020 A | 2/2005  |

(Continued)

OTHER PUBLICATIONS

Official Communication issued in International Patent Application No. PCT/JP2009/050666, mailed on Apr. 14, 2009.

*Primary Examiner* — Dean O Takaoka
*Assistant Examiner* — Alan Wong
(74) *Attorney, Agent, or Firm* — Keating & Bennett, LLP

(57) ABSTRACT

An elastic wave device has a structure that prevents flux from flowing into a hollow space of the device during mounting of the device using solder bumps. The elastic wave device includes a substrate, a vibrating portion located on a first main surface of the substrate, pads located on the first main surface of the substrate and electrically connected to electrodes of the vibrating portion, a supporting layer arranged on the first main surface of the substrate so as to enclose the vibrating portion, a sheet-shaped cover layer composed of resin including synthetic rubber and disposed on the supporting layer so as to form a hollow space around the periphery of the vibrating portion, a protective layer composed of resin having resistance to flux and disposed on a side of the cover layer remote from the supporting layer, via conductors extending through the protective layer, the cover layer, and the supporting layer and connected to the pads, and external electrodes including solder bumps, disposed at ends of the via conductors adjacent to the protective layer.

7 Claims, 7 Drawing Sheets

U.S. PATENT DOCUMENTS

| | | |
|---|---|---|
| 7,586,240 B2 * | 9/2009 | Tsuda et al. .................. 310/344 |
| 7,906,355 B2 * | 3/2011 | Hodono .......................... 438/27 |
| 7,913,367 B2 * | 3/2011 | Tsuda .......................... 29/25.35 |
| 2001/0052831 A1 | 12/2001 | Milsom |
| 2005/0158557 A1 | 7/2005 | Noro |
| 2005/0200434 A1 | 9/2005 | Takano |
| 2006/0246623 A1 | 11/2006 | Matsuki et al. |
| 2007/0039666 A1 | 2/2007 | Hayashi et al. |
| 2007/0115079 A1 * | 5/2007 | Kubo et al. .................. 333/189 |
| 2007/0251419 A1 * | 11/2007 | Yamaguchi et al. ..... 106/287.13 |

FOREIGN PATENT DOCUMENTS

| | | |
|---|---|---|
| CN | 1807539 A | 7/2006 |
| CN | 1916234 A | 2/2007 |
| JP | 60-189307 A | 9/1985 |
| JP | 2002-261582 A | 9/2002 |
| JP | 2006-225523 A | 8/2006 |
| JP | 2006-352430 A | 12/2006 |
| JP | 2007-143192 A | 6/2007 |
| WO | 2006/019041 A1 | 2/2006 |
| WO | WO 2007083432 A1 * | 7/2007 |

* cited by examiner

ELASTIC WAVE DEVICE AND METHOD FOR MANUFACTURING THE SAME

BACKGROUND OF THE INVENTION

1. Field of the Invention

The present invention relates to elastic wave devices and methods for manufacturing the same, and in particular, relates to elastic wave devices including vibrating portions such as resonators and filters located on substrates and methods for manufacturing the same.

2. Description of the Related Art

To date, elastic wave devices including substrates, vibrating portions formed on the substrates, and cover layers covering the vibrating portions have been proposed.

FIGS. 9A to 9C illustrate an example configuration of an elastic wave device. FIG. 9A is a cross-sectional view, FIG. 9B is a cross-section taken along line X-X in FIG. 9A viewed from above, and FIG. 9C is a cross-section taken along line X-X in FIG. 9A viewed from below. As shown in FIGS. 9A to 9C, a surface acoustic wave device 110 includes a piezoelectric substrate 111, a conductive pattern including IDT electrodes 112, pads 113, and wiring lines 118 formed on a first main surface 111a of the piezoelectric substrate, a frame-shaped supporting layer 116 composed of resin formed so as to enclose a vibrating portion including the IDT electrodes 112, and a cover layer 115 formed of an insulating sheet formed on the supporting layer 116. External electrodes 117 are formed on the cover layer 115, and the external electrodes 117 and the pads 113 are electrically connected to each other by via conductors 114 extending through the cover layer 115 and the supporting layer 116 (for example, see Japanese Unexamined Patent Application Publication No. 2002-261582

When an elastic wave device having the above-described structure is mounted on, for example, another circuit board using solder bumps formed on the external electrodes, flux is applied to the solder bumps so as to improve the solder wettability. However, the flux often flows into a hollow space through the cover layer.

SUMMARY OF THE INVENTION

Accordingly, preferred embodiments of the present invention provide an elastic wave device having a structure with which flux does not flow into a hollow space of the device during mounting of the device using solder bumps.

An elastic wave device according to a preferred embodiment of the present invention includes a substrate; a vibrating portion located on a first main surface of the substrate; a pad located on the first main surface of the substrate and electrically connected to an electrode of the vibrating portion; a supporting layer having a thickness larger than that of the vibrating portion and located on the first main surface of the substrate so as to enclose the vibrating portion; a sheet-shaped cover layer composed of resin including synthetic rubber, arranged on the supporting layer so as to cover the vibrating portion and to form a hollow space around the periphery of the vibrating portion; a protective layer composed of resin having resistance to flux and located on a side of the cover layer remote from the supporting layer; a via conductor extending through the protective layer, the cover layer, and the supporting layer and being connected to the pad; and an external electrode including a solder bump and located at an end of the via conductor adjacent to the protective layer.

During mounting of the elastic wave device, flux is applied to the solder bump so as to improve solder wettability. However, the flux often flows into the hollow space in conventional devices. The inventors discovered that the flux passed through the cover layer since the cover layer was composed of resin including synthetic rubber. Synthetic rubber needs to be added to resin so that the cover layer has toughness and does not easily crack even when the cover layer has a sheet-shaped configuration.

When the protective layer composed of resin having resistance to flux is disposed on the sheet-shaped cover layer composed of resin including synthetic rubber as in the above-described structure, the flux does not pass through the protective layer. Accordingly, the flux can be prevented from flowing into the hollow space.

More specifically, the device can have various aspects as described below.

According to an aspect of a preferred embodiment of the present invention, the substrate may be a piezoelectric substrate. The vibrating portion may include an IDT electrode. In this case, the elastic wave device may be a surface acoustic wave device.

According to another aspect of a preferred embodiment of the present invention, the substrate may be an insulating substrate. The vibrating portion may include a piezoelectric thin film having electrodes formed on both sides thereof. In this case, the elastic wave device may be a bulk acoustic wave device such as a bulk acoustic wave resonator (BAW resonator).

Preferably, the protective layer is composed of the same material as the supporting layer such that the variety of materials can be reduced, and manufacturing processes can be simplified.

Preferably, the protective layer is composed of photosensitive polyimide resin. As a result, a difference in brightness profile between the solder bump and the protective layer becomes large, and it becomes easy for the solder bump to be recognized. Accordingly, the elastic wave device can be mounted with higher accuracy compared with when the external shape of the elastic wave device is recognized.

Preferably, the cover layer is composed of non-photosensitive epoxy resin so as to allow for a low temperature curing process.

Preferably, the device further includes a nitride film or an oxide film at least partially interposed between the substrate and the supporting layer so that the nitride film or the oxide film has a surface rougher than that of the piezoelectric substrate. Therefore, adhesiveness can be improved by an anchoring effect. As a result, problems that cause poor characteristics during processes after the formation of the hollow space, for example, entering of plating solution into the hollow space, can be prevented.

Moreover, another preferred embodiment of the present invention provides a method for manufacturing an elastic wave device including a first step of forming a vibrating portion and a pad electrically connected to an electrode of the vibrating portion on a first main surface of a substrate; a second step of forming a supporting layer having a thickness larger than that of the vibrating portion on the first main surface of the substrate so as to enclose the vibrating portion; a third step of forming a sheet-shaped cover layer composed of resin including synthetic rubber on the supporting layer so as to cover the vibrating portion and to form a hollow space around the periphery of the vibrating portion; a fourth step of forming a protective layer composed of resin having resistance to flux on a side of the cover layer remote from the supporting layer; a fifth step of forming a via conductor extending through the protective layer, the cover layer, and the supporting layer and connected to the pad; and a sixth step of forming an external electrode including a solder bump at an end of the via conductor remote from the protective layer.

During mounting of the elastic wave device manufactured by the above-described method, flux is applied to the solder bump so as to improve solder wettability. The flux often flows into the hollow space when only the cover layer is disposed on the hollow space since the flux passes through the cover layer composed of resin including synthetic rubber. In contrast, when the protective layer composed of resin having resistance to flux is formed on the cover layer as in a preferred embodiment of the present invention, the flux does not pass through the protective layer composed of resin having resistance to flux, and can be prevented from flowing into the hollow space.

Preferably, the method includes a seventh step of forming a groove in the substrate from the first main surface of the substrate to a predetermined depth; and an eighth step of grinding a second main surface of the substrate opposite to the first main surface so as to reduce the thickness of the substrate and to divide the substrate into chips.

In this case, a plurality of elastic wave devices having a thinned substrate can be manufactured in a mother board at the same time while cracking caused by warpage of the substrate is prevented.

That is, in order to reduce the thickness of the substrate, in general, chips are cut out by dicing after the second main surface of the substrate remote from the hollow space is ground until the substrate is reduced to a desired thickness. In this method, stress remaining in, for example, the supporting layer and the cover layer that form the hollow space disadvantageously causes high warpage and cracking of the substrate when the thickness thereof is reduced. In the case of the substrate having the hollow space, the substrate does not significantly warp at the moment when the thickness thereof is reduced when a groove is cut from the first main surface of the substrate to a predetermined position in advance and the thickness of the substrate is reduced by grinding the second main surface. Therefore, cracking caused by the warpage of the substrate can be prevented.

The supporting layer, the cover layer, and the protective layer can be cut when the groove is formed in the substrate. Moreover, the substrate can be divided into chips by reducing the thickness of the substrate until the second main surface reaches the groove or by folding the substrate along the groove after the thickness of the substrate is reduced until the second main surface reaches to just short of the groove.

In addition, another preferred embodiment of the present invention provides a method for manufacturing an elastic wave device. A method for manufacturing an elastic wave device includes a first step of forming a vibrating portion and a pad electrically connected to an electrode of the vibrating portion on a first main surface of a substrate; a second step of forming a supporting layer having a thickness larger than that of the vibrating portion on the first main surface of the substrate so as to enclose the vibrating portion; a third step of forming a sheet-shaped cover layer composed of resin including synthetic rubber on the supporting layer so as to cover the vibrating portion and to form a hollow space around the periphery of the vibrating portion; a fourth step of forming a protective layer composed of resin having resistance to flux on a side of the cover layer remote from the supporting layer; a fifth step of forming a via conductor extending through the protective layer, the cover layer, and the supporting layer and connected to the pad; and a sixth step of forming an external electrode formed of a solder bump at an end of the via conductor remote from the protective layer.

During mounting of the elastic wave device manufactured by the above-described method, flux is applied to the solder bump so as to improve solder wettability. The flux often flows into the hollow space when only the cover layer is disposed on the hollow space since the flux passes through the cover layer composed of resin including synthetic rubber. In contrast, when the protective layer composed of resin having resistance to flux is formed on the cover layer as in a preferred embodiment of the present invention, the flux does not pass through the protective layer composed of resin having resistance to flux, and can be prevented from flowing into the hollow space.

Preferably, the method further includes a sixth step of forming a groove in the substrate from the first main surface of the substrate to a predetermined depth; and a seventh step of grinding a second main surface of the substrate opposite to the first main surface so as to reduce the thickness of the substrate and to divide the substrate into chips.

In this case, a plurality of elastic wave devices having a thinned substrate can be manufactured in a mother board at the same time while cracking caused by warpage of the substrate is prevented.

That is, in order to reduce the thickness of the substrate, in general, chips are cut out by dicing after the second main surface of the substrate remote from the hollow space is ground until the substrate is reduced to a desired thickness. In this method, stress remaining in, for example, the supporting layer and the cover layer that form the hollow space disadvantageously causes high warpage and cracking of the substrate when the thickness thereof is reduced. In the case of the substrate having the hollow space, the substrate does not significantly warp at the moment when the thickness thereof is reduced when a groove is cut from the first main surface of the substrate to a predetermined position in advance and the thickness of the substrate is reduced by grinding the second main surface. Therefore, cracking caused by the warpage of the substrate can be prevented.

The supporting layer, the cover layer, and the protective layer can be cut when the groove is formed in the substrate. Moreover, the substrate can be divided into chips by reducing the thickness of the substrate until the second main surface reaches the groove or by folding the substrate along the groove after the thickness of the substrate is reduced until the second main surface reaches to just short of the groove.

According to various preferred embodiments of the present invention, a protective layer prevents flux from flowing into a hollow space of an elastic wave device during mounting of the device using solder bumps.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Examples serving as preferred embodiments of the present invention will now be described with reference to FIGS. 1 to 8.

Example 1

An electronic component 30 of Example 1 will now be described with reference to FIGS. 1 to 4 and FIG. 8.

Figure 1:
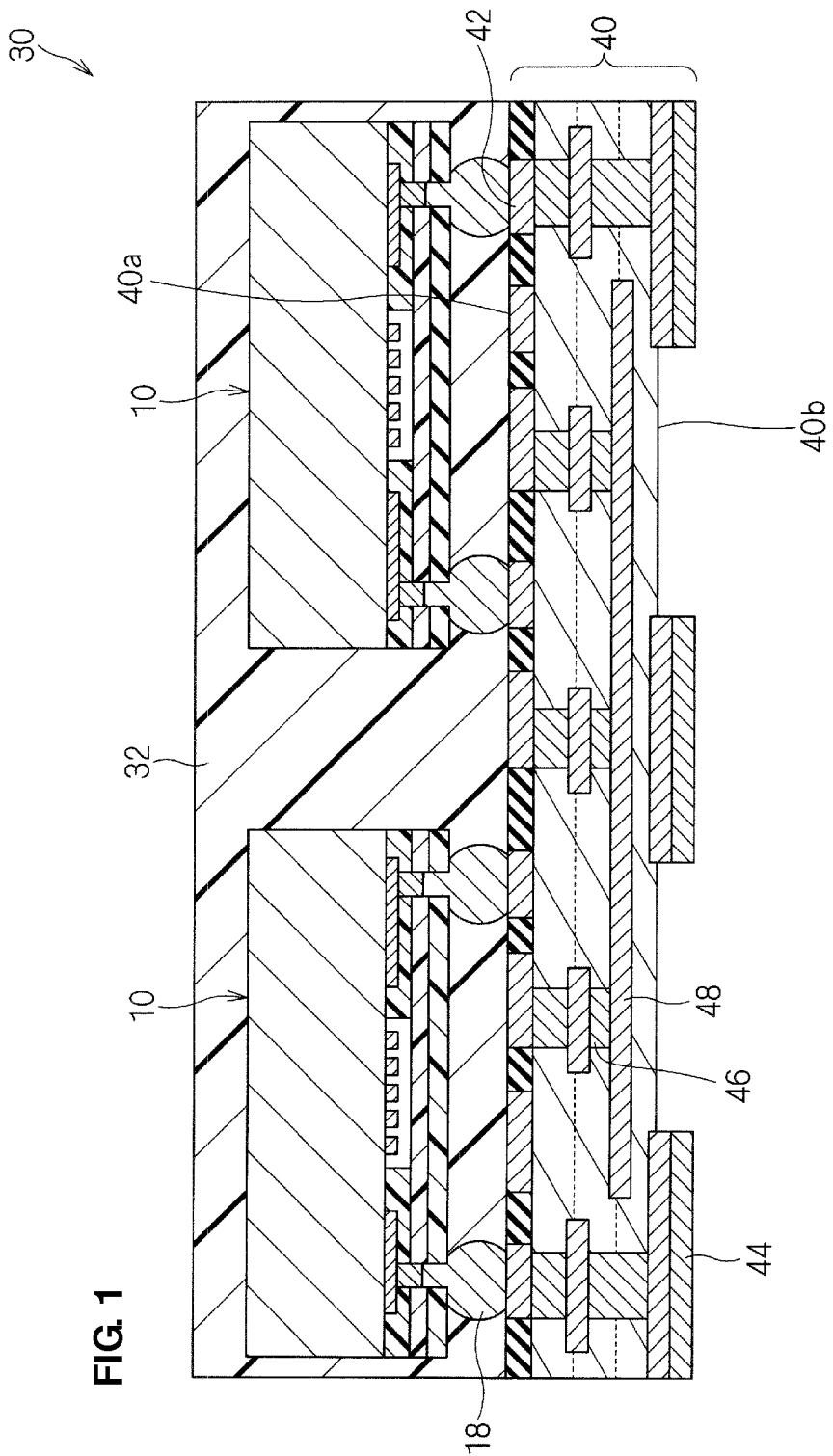
FIG. 1 is a cross-sectional view of an electronic component including a surface acoustic wave device mounted thereon according to a preferred embodiment of the present invention.

As shown in a cross-sectional view in FIG. 1, an electronic component 30 of Example 1 includes two surface acoustic wave devices 10 mounted on an upper surface 40a serving as a first main surface of a common substrate 40. That is, lands 42 located in the upper surface 40a of the common substrate 40 and the surface acoustic wave devices 10 are electrically connected to each other with solder bumps 18 interposed therebetween. A resin 32 is disposed over the surface acoustic wave devices 10 so as to cover the surface acoustic wave devices 10. External electrodes 44 used for mounting the electronic component 30 on, for example, other circuit boards are exposed at a lower surface 40b serving as a second main surface of the common substrate 40. Via conductors 46 and internal wiring patterns 48 that electrically connect the lands 42 and the external electrodes 44 are located inside the common substrate 40.

For example, the electronic component 30 can be a duplexer, and can include the surface acoustic wave devices 10 as surface-acoustic-wave filter elements for transmission and reception mounted side by side on the common substrate 40.

Figure 4:
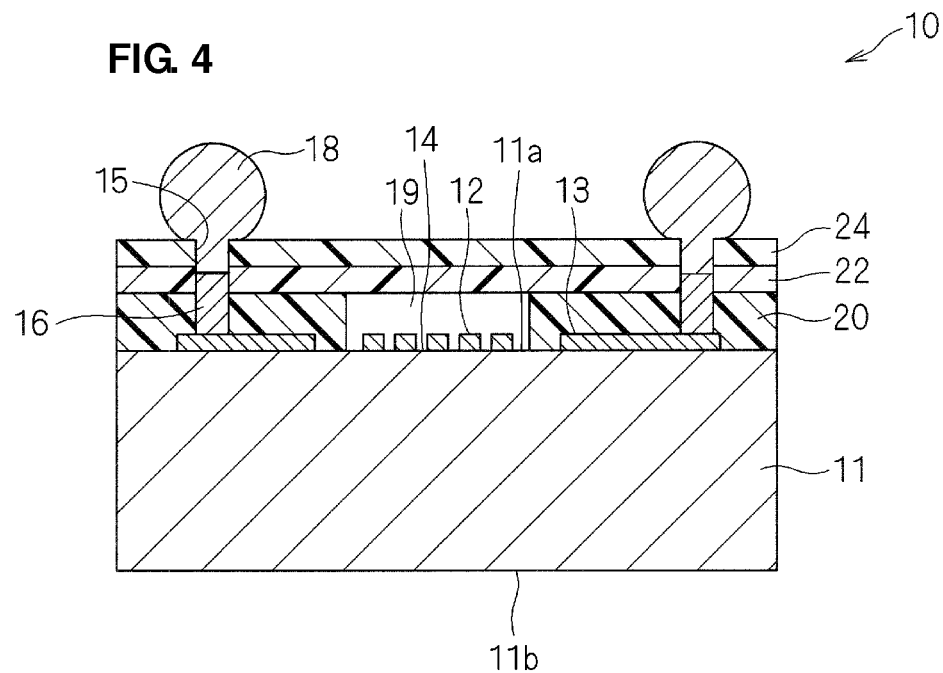
FIG. 4 is a cross-sectional view of a surface acoustic wave device according to a preferred embodiment of the present invention.

As shown in a cross-sectional view in FIG. 4, the surface acoustic wave devices 10 each include a piezoelectric substrate 11 and an element portion, for example, a SAW (surface acoustic wave) filter located on the piezoelectric substrate. That is, an IDT (interdigital transducer) electrode 12 serving as a comb-shaped electrode of a vibrating portion 14, pads 13, and a conductive pattern including wiring lines (not shown) that connect the IDT electrode 12 and the pads 13 to each other are disposed on an upper surface 11a serving as a first main surface of the piezoelectric substrate 11. A frame-shaped supporting layer 20 is arranged so as to enclose the vibrating portion 14 including the IDT electrode 12. The thickness of the supporting layer 20 is larger than that of the conductive pattern such as the IDT electrode 12 of the vibrating portion 14. The supporting layer 20 is also located on the pads 13.

A cover layer 22 is disposed on the supporting layer 20, and the periphery of the vibrating portion 14 disposed on the piezoelectric substrate 11 is covered with the supporting layer 20 and the cover layer 22 serving as insulating members, thereby forming a hollow space 19. Surface acoustic waves freely propagate along the upper surface 11a of the piezoelectric substrate 11 in a portion adjacent to the hollow space 19. A protective layer 24 is located on the cover layer 22.

Via holes (through-holes) 15 extending to the pads 13 located on the upper surface 11a of the piezoelectric substrate 11 are formed in the protective layer 24, the cover layer 22, and the supporting layer 20. Under-bump metals 16 serving as via conductors are disposed in the via holes 15, and solder bumps 18 are located on the under-bump metals 16 so as to be exposed to the outside.

Next, manufacturing processes of the electronic component 30 will be described.

First, manufacturing processes of the surface acoustic wave device 10 will be described with reference to cross-sectional views in FIGS. 2A to 3F. A plurality of surface acoustic wave devices 10 are manufactured in a mother board (wafer) at the same time.

Figure 2A:
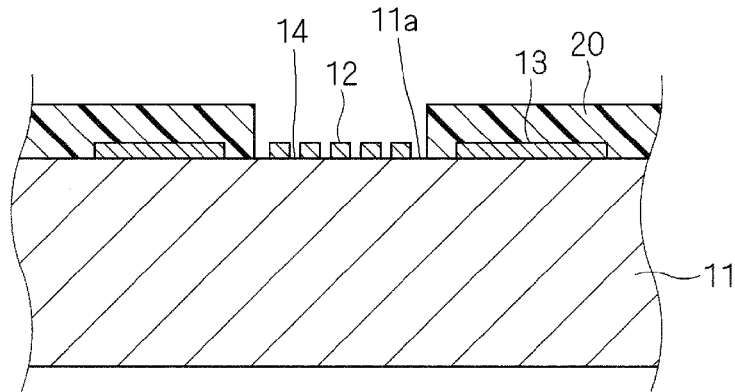
FIGS. 2A to 2C are cross-sectional views illustrating a method for manufacturing a surface acoustic wave device according to a preferred embodiment of the present invention.

As shown in FIG. 2A, the IDT electrode 12, the pads 13, and the conductive pattern including wiring lines (not shown) that connect the IDT electrode 12 and the pad 13 to each other are located on the first main surface 11a of the piezoelectric substrate 11, and the supporting layer 20 is arranged around the periphery of the vibrating portion 14 including the IDT electrode 12. In order to form the supporting layer 20, photosensitive polyimide resin, for example, is applied onto the entire first main surface 11a of the piezoelectric substrate 11, and the resin is opened (removed) at the periphery of the vibrating portion 14 including the IDT electrode 12 using a photolithographic technique.

Figure 2B:
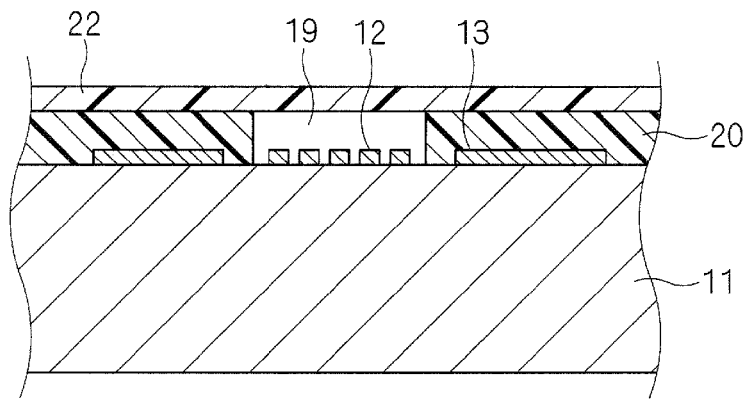

Next, as shown in FIG. 2B, the sheet-shaped cover layer is formed on the supporting layer 20 by, for example, lamination. The cover layer 22 is composed of, for example, non-photosensitive epoxy resin which allows a low temperature curing process.

Figure 2C:
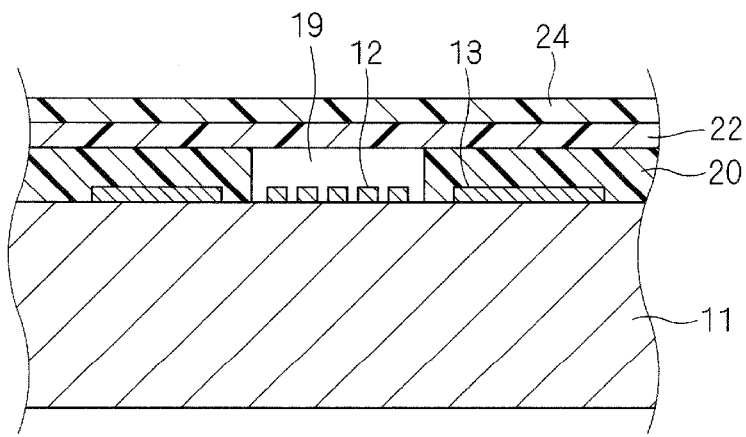

Next, as shown in FIG. 2C, the protective layer 24 is formed on the cover layer 22. The protective layer 24 is composed of, for example, photosensitive polyimide resin, which is the same material as the supporting layer 20.

The cover layer 22 and the protective layer 24 can be formed at the same time by placing a sheet-shaped multiple layer including a sheet to be the cover layer 22 and a sheet to be the protective layer 24 stacked in advance on the supporting layer 20 instead of stacking the protective layer 24 after stacking the cover layer 22 on the supporting layer 20.

Figure 3D:
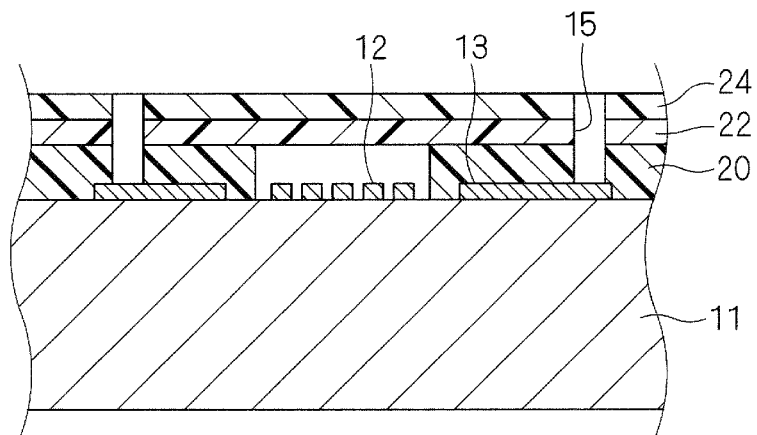
FIGS. 3D to 3F are cross-sectional views illustrating a method for manufacturing a surface acoustic wave device according to a preferred embodiment of the present invention.

Next, as shown in FIG. 3D, the via holes 15 are formed by laser processing so as to extend through the protective layer 24, the cover layer 22, and the supporting layer 20 and such that the pads 13 at the bottoms of the via holes are exposed therethrough.

Figure 3E:
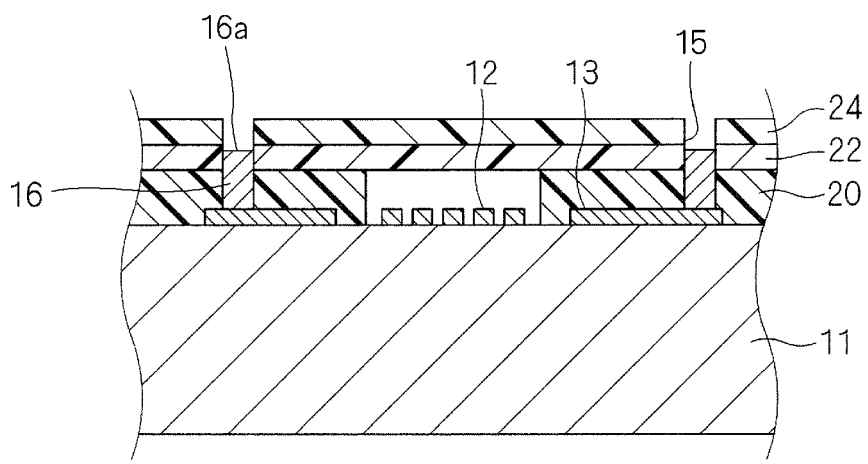

Next, as shown in FIG. 3E, the under-bump metals 16 serving as via conductors are formed in the via holes 15 by electrolytic plating (using, Cu, Ni, or the like), and Au for antioxidation having a thickness of about 0.05 μm to about 0.1 μm, for example, is formed on surfaces 16a of the under-bump metals 16, for example.

Figure 3F:
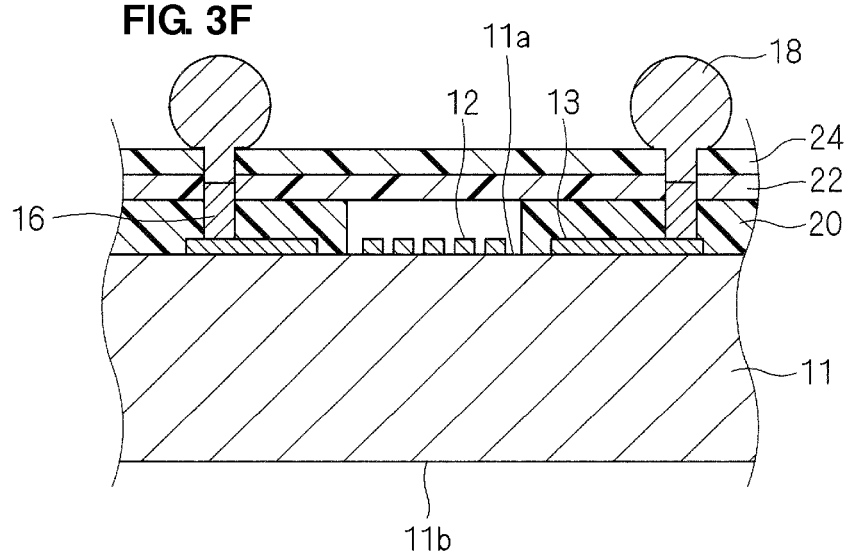

Next, as shown in FIG. 3F, solder paste such as Sn—Ag—Cu is printed immediately above the under-bump metals 16 with the metal masks interposed therebetween, and is heated at, for example, about 260° C., at which the solder paste melts so that the solder becomes fixed to the under-bump metals 16. Flux is removed using a flux cleaner. With this, the spherical solder bumps 18 are formed.

Next, grooves are cut from the protective layer 24 to a predetermined depth in the piezoelectric substrate 11 by, for example, dicing, and the bottom surface (second main surface) 11b of the piezoelectric substrate 11 is ground so that the thickness of the substrate is reduced and thereby that the board is divided into chips. This completes the preparation of the surface acoustic wave device 10 shown in FIG. 4. The supporting layer 20, the cover layer 22, and the protective layer 24 can be cut when the grooves are cut. Moreover, the board can be divided into chips by reducing the thickness of the piezoelectric substrate 11 until the bottom surface reaches the grooves or by folding the piezoelectric substrate 11 along the grooves after the thickness of the piezoelectric substrate 11 is reduced until the bottom surface reaches to just short of the grooves.

In order to reduce the thickness of the piezoelectric substrate 11, in general, the bottom surface 11b of the substrate remote from the hollow space 19 is ground until the substrate is reduced to a desired thickness before chips are cut out by dicing. In this method, stress remaining in the resins such as the supporting layer 20 and the cover layer 22 that form the hollow space 19 disadvantageously causes high warpage and cracking of the piezoelectric substrate 11 serving as a mother board when the thickness thereof is reduced. In the case of the piezoelectric substrate 11 having the hollow space 19, the piezoelectric substrate 11 does not significantly warp at the moment when the thickness thereof is reduced when grooves are cut from the first main surface 11a of the piezoelectric substrate 11 to a predetermined position in advance and the thickness of the substrate is reduced by grinding the bottom surface 11b. Therefore, cracking caused by the warpage of the piezoelectric substrate 11 can be prevented.

Next, processes of manufacturing the electronic component 30 by mounting the manufactured surface acoustic wave devices 10 will be described. A plurality of electronic components 30 are manufactured in a mother board at the same time.

First, the surface acoustic wave devices 10 are mounted on a printed circuit board to be the common substrate 40. When the devices are mounted, flux is applied to the solder bumps 18 so as to improve the solder wettability.

Next, the surface acoustic wave devices 10 are embedded in the resin 32 by, for example, lamination or resin molding while being pressurized at about 2 Pa to about 5 Pa, for example, and then the board is divided into chips. This completes the fabrication of the electronic component 30 shown in FIG. 1.

For example, the thickness of the supporting layer 20 is about 15 μm, the thickness of the cover layer 22 is about 30 μm, and the thickness of the protective layer 24 is about 3 μm, for example.

The cover layer 22 can be a sheet of resin including synthetic rubber, for example, a sheet of non-photosensitive epoxy resin. The cover layer 22 has toughness even when it has a sheet-shaped configuration due to the addition of the synthetic rubber, and does not crack easily.

Figure 8:
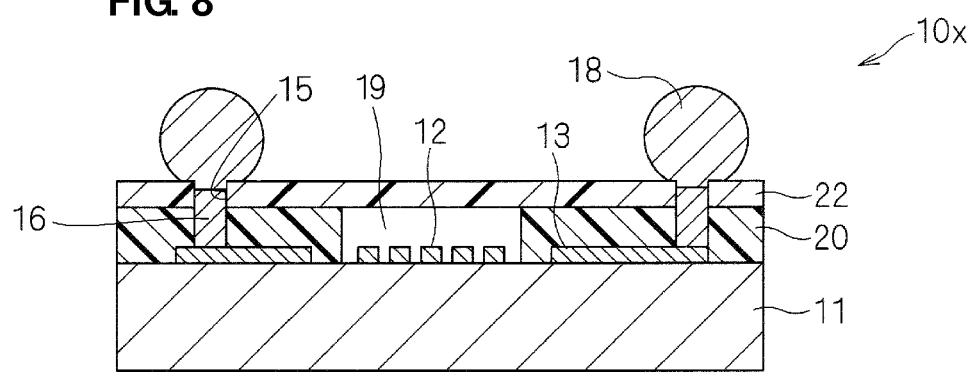
FIG. 8 is a perspective view of an elastic wave device.
Figure 9A:
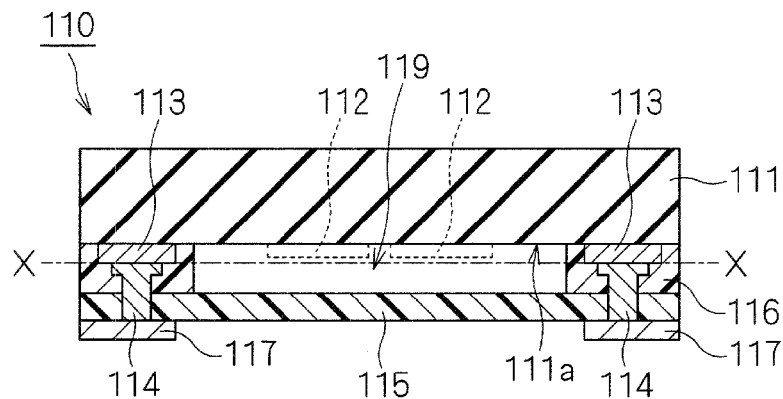
FIGS. 9A to 9C are cross-sectional views of principal portions of a conventional elastic wave device.
Figure 9B:
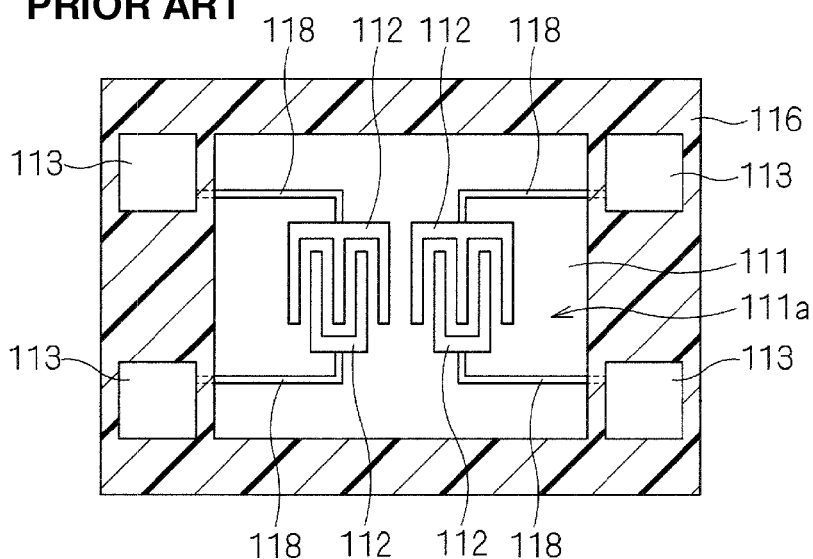
Figure 9C:
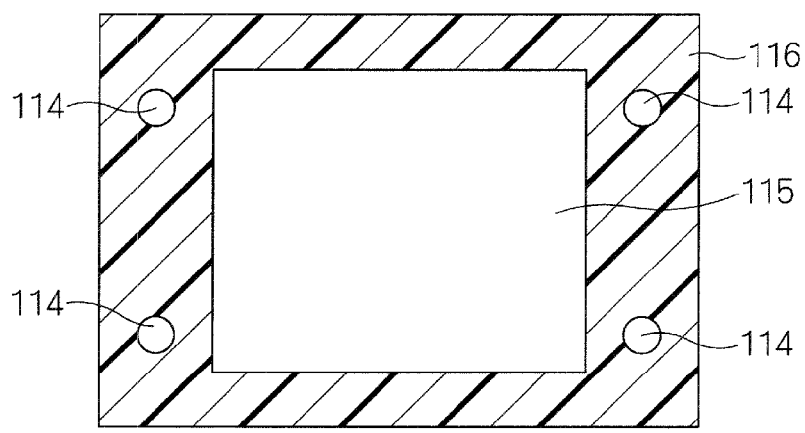

However, when the solder bumps 18 are formed immediately above the cover layer 22 as in a surface acoustic wave device 10x shown in a cross-sectional view in FIG. 8, flux often flows into the hollow space 19 through the cover layer 22 composed of resin including synthetic rubber such as acrylic rubber.

Therefore, the protective layer 24 composed of resin having resistance to flux is formed on the cover layer 22 as shown in FIG. 4, and the solder bumps 18 are formed thereon. With this, flux does not pass through the protective layer 24 composed of resin having resistance to flux, and can be prevented from flowing into the hollow space 19.

Although the material of the protective layer 24 can differ from that of the supporting layer 20, the material of the protective layer 24 is preferably the same as that of the supporting layer 20 when the supporting layer 20 is composed of resin having resistance to flux since the variety of materials is not increased and thereby manufacturing processes can be simplified.

During the process for mounting the surface acoustic wave devices 10, accuracy in mounting the surface acoustic wave devices 10 can be improved by mounting the devices by recognizing the solder bumps 18 rather than mounting the devices by recognizing the external shapes of the devices, the shape being affected by dicing accuracy. In particular, when the protective layer 24 is composed of the same photosensitive polyimide resin as the supporting layer 20, a difference in brightness profile between the solder bumps 18 and the protective layer 24 becomes large, and it becomes easy for the solder bump 18 to be recognized. Accordingly, the surface acoustic wave devices 10 can be mounted with higher accuracy compared with when the external shapes of the surface acoustic wave devices 10 are recognized.

The hollow space 19 is hermetically sealed by the resin 32. Openings for the via holes can be formed in the supporting layer 20 such that the pads 13 are at least partially exposed when the supporting layer is formed. However, when the via holes that extend through the cover layer and the protective layer are formed by laser processing after the cover layer and the protective layer are formed on the supporting layer having the openings for the via holes, a portion of the material (for example, filler) of the cover layer adheres to the bottoms of the via holes, i.e., the pads, and adversely affects adhesiveness between the pads and the platings subsequently disposed in the via holes.

When the openings for the via holes are not formed in the supporting layer during the formation of the supporting layer and the via holes are formed in the supporting layer, the cover layer, and the protective layer by laser processing at the same time after the formation of the cover layer and the protective layer, the above-described problem does not occur, and adhesiveness between the pads and the platings disposed in the via holes can be improved.

When the surface acoustic wave devices 10 are embedded in the resin 32, it is necessary to select the parameters of the supporting layer 20 and the cover layer 22 so that the hollow space 19 does not collapse. The size of the hollow space 19 required to realize a SAW filter used in an 800 MHz band, which requires the largest size in frequency bands in which general SAW filters are used, is approximately 400 μm×1000 μm, for example. In order to form the hollow space 19 having the size of approximately 400 μm×1000 μm without it collapsing, the parameters of the supporting layer 20 and the cover layer 22 can be selected so as to satisfy the following conditions:

Thickness of cover layer≧30 μm
Elastic modulus of material of cover layer≧3 GPa
Thickness of supporting layer≧10 μm
Elastic modulus of material of supporting layer≧2.5 GPa The thickness of the protective layer 24 and the elastic modulus of the material of the protective layer 24 can be ignored as conditions to be adjusted so that the hollow space 19 does not collapse since the thickness of the protective layer 24 can be smaller than that of the cover layer 22.

Example 2

A surface acoustic wave device 10a of Example 2 will now be described with reference to FIG. 5.

The surface acoustic wave device 10a of Example 2 has the same structure as the surface acoustic wave device 10 of Example 1 except for the following differences.

Figure 5:
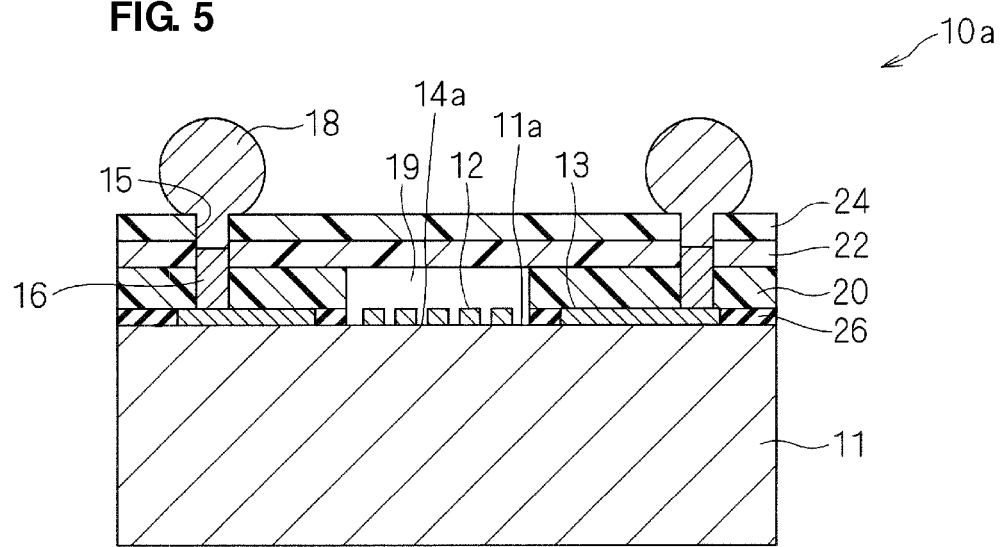
FIG. 5 is a cross-sectional view of another surface acoustic wave device according to another preferred embodiment of the present invention.

That is, as shown in a cross-sectional view in FIG. 5, an intermediate layer 26 is formed between the supporting layer 20 and the piezoelectric substrate 11. The intermediate layer 26 is formed in an area except for the portions of a vibrating portion 14a including the IDT electrode 12 and the pads 13 so as to enclose the vibrating portion 14a and to be interposed between the piezoelectric substrate 11 and the supporting layer 20. The intermediate layer 26 can improve adhesiveness.

A $SiO_2$ film serving as the intermediate layer 26 is formed by, for example, forming the conductive pattern on the $LiTaO_3$ piezoelectric substrate 11 as in Example 1, forming the $SiO_2$ film on the substrate by sputtering, and then removing a portion of the $SiO_2$ film formed in portions from which the $SiO_2$ film is required to be removed, for example, the areas in which the vibrating portion 14a and the pads 13 are formed, by dry etching. A SiN film can be formed instead of the $SiO_2$ film. Subsequently, the supporting layer 20 and the like are formed as in Example 1.

Adhesion strength can be improved by an anchoring effect since the $SiO_2$ film or the SiN film serving as the intermediate layer 26 has a surface rougher than that of the piezoelectric substrate 11. These films can be formed by sputtering or CVD (chemical vapor deposition).

The hollow space 19 can be kept fluid-tight by forming the intermediate layer 26 between the piezoelectric substrate 11 and the supporting layer 20. With this, problems that cause poor characteristics during processes after the formation of the hollow space, for example, entering of plating solution into the hollow space 19 during plating of the via holes, can be prevented.

The $SiO_2$ film can be removed such that the areas to be removed are larger than those of the pads 13. In this case, portions of the supporting layer 20 are also formed on the piezoelectric substrate 11 around the periphery of the pads 13. However, the intermediate layer 26 only needs to be interposed between the other portions of the supporting layer 20 and the piezoelectric substrate 11 and to enclose the vibrating portion 14a at a position closer to the IDT electrode 12 than the pads 13.

Example 3

An electronic component 30x of Example 3 will now be described with reference to FIGS. 6 and 7.

Figure 6:
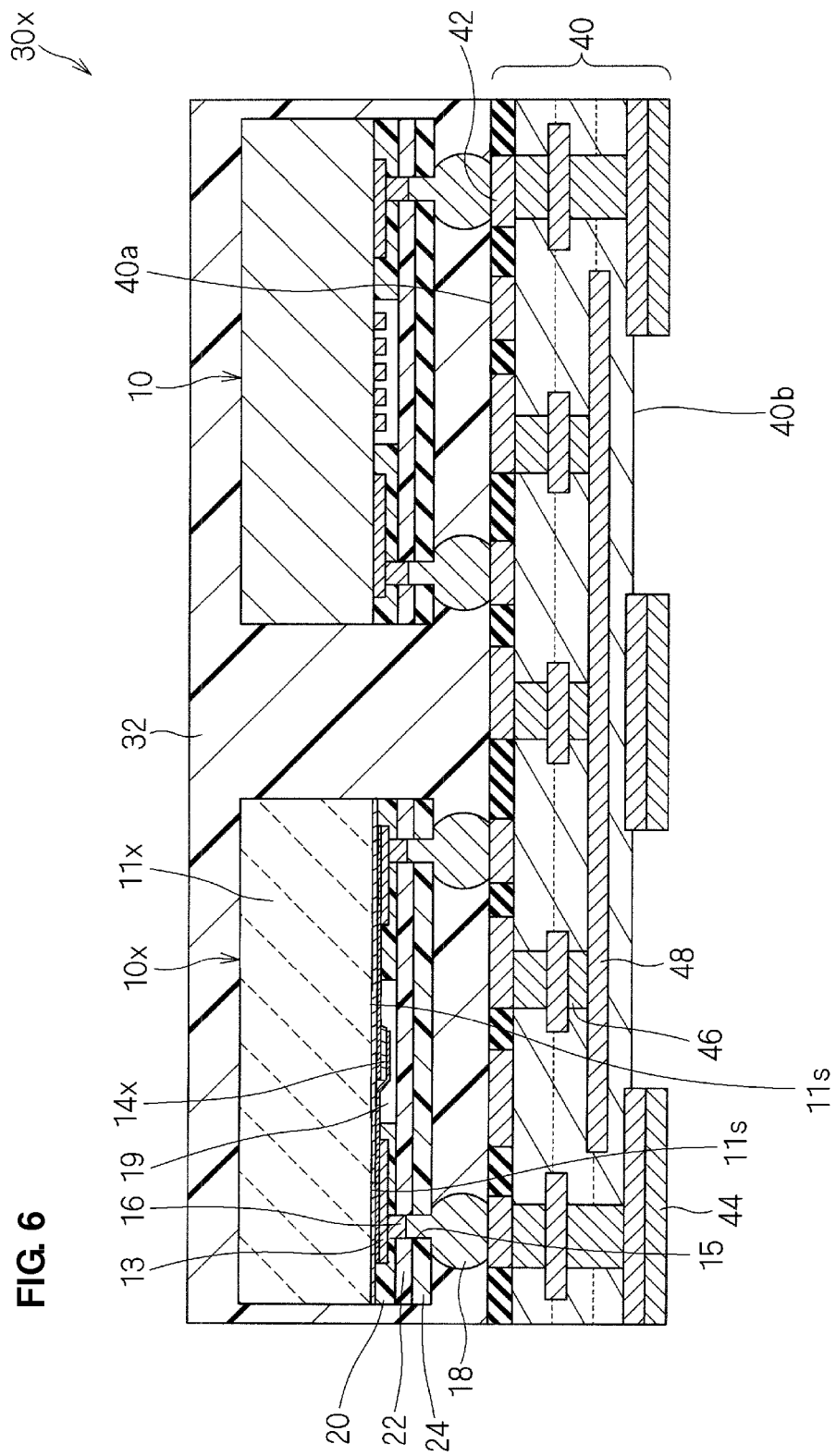
FIG. 6 is a cross-sectional view of an electronic component including a bulk acoustic wave device mounted thereon according to a preferred embodiment of the present invention.

As shown in a cross-sectional view in FIG. 6, the electronic component 30x of Example 3 has substantially the same structure as the electronic component 30 of the Example 1. Only differences from Example 1 will be focused on in the following descriptions, and the same reference sings are used for components common to those in Example 1.

Unlike the electronic component 30 of Example 1, the electronic component 30x of Example 3 includes the surface acoustic wave device 10 and a bulk acoustic wave device 10x mounted on the upper surface 40a serving as the first main surface of the common substrate 40. That is, the lands 42 formed in the upper surface 40a of the common substrate 40 are electrically connected to the surface acoustic wave device 10 and the bulk acoustic wave device 10x with the solder bumps 18 interposed therebetween. The resin 32 is disposed over the surface acoustic wave device 10 and the bulk acoustic wave device 10x so as to cover the surface acoustic wave device 10 and the bulk acoustic wave device 10x. The external electrodes 44 used for mounting the electronic component 30x on, for example, other circuit boards are exposed at the lower surface 40b serving as the second main surface of the common substrate 40. The via conductors 46 and the internal wiring patterns 48 that electrically connect the lands 42 and the external electrodes 44 are formed inside the common substrate 40.

For example, the electronic component 30x can be a duplexer, and can include the surface acoustic wave device 10 as a surface-acoustic-wave filter element and the bulk acoustic wave device 10x as a bulk-acoustic-wave filter element, one of which is for transmission and the other is for reception.

The bulk acoustic wave device 10x has substantially the same structure as the surface acoustic wave device 10 of Example 1 except that a vibrating portion 14x is formed on an insulating substrate 11x composed of, for example, Si.

That is, the bulk acoustic wave device 10x has a package structure similar to that of the surface acoustic wave device 10. The bulk acoustic wave device 10x includes the frame-shaped supporting layer 20 formed on a first main surface 11s of the substrate 11x around the periphery of the vibrating portion 14x formed on the surface. The thickness of the supporting layer is larger than that of the vibrating portion 14x. The supporting layer 20 is formed also on the pads 13. The cover layer 22 is disposed on the supporting layer 20, and the periphery of the vibrating portion 14x is covered with the supporting layer 20 and the cover layer 22 serving as insulating members, thereby forming the hollow space 19. The protective layer 24 is formed on the cover layer 22. The via holes (through-holes) 15 extending to the pads 13 are formed in the protective layer 24, the cover layer 22, and the supporting layer 20. The under-bump metals 16 serving as via conductors are disposed in the via holes 15, and the solder bumps 18 are formed on the under-bump metals 16 so as to be exposed to the outside.

The above-described package structure is not limited to the bulk acoustic wave device of the SMR type of Example 3, and can also be applied to a bulk acoustic wave device in which a vibrating portion is disposed above a hollow formed in a substrate or in which a vibrating portion is supported while being suspended above a substrate by, for example, removing a dummy layer.

Figure 7:
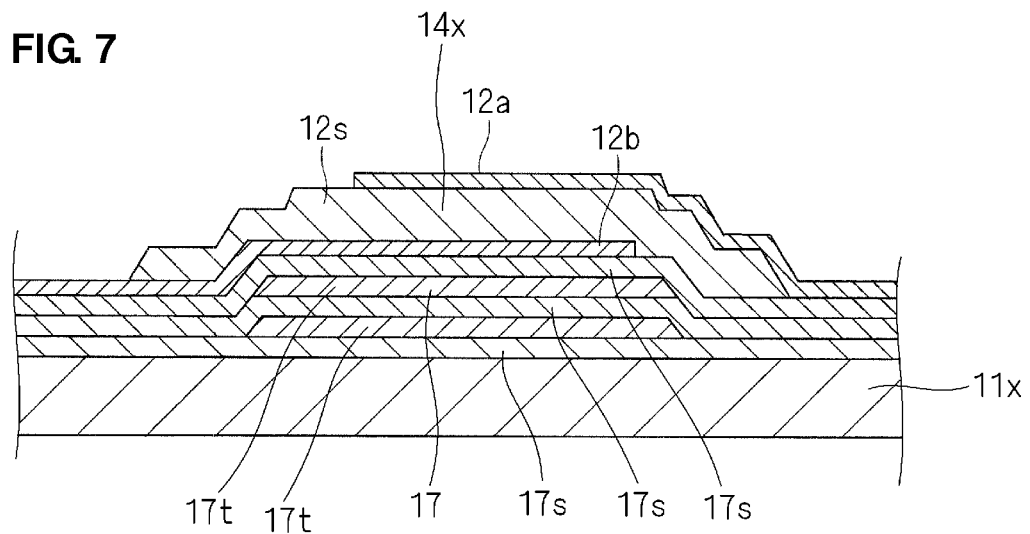
FIG. 7 is a cross-sectional view of a bulk acoustic wave device according to a preferred embodiment of the present invention.

As shown in a cross-sectional view of a principal portion in FIG. 7, the bulk acoustic wave device 10x includes the vibrating portion 14x including an upper electrode 12a, a lower electrode 12b, and a piezoelectric thin film 12s interposed therebetween unlike the surface acoustic wave device 10 of Example 1. The vibrating portion 14x is acoustically separated from the insulating substrate 11x by a reflector 17 interposed therebetween.

The reflector 17 includes low acoustic impedance layers 17s with a relatively low acoustic impedance and high acoustic impedance layers 17t with a relatively high acoustic impedance alternately stacked on the insulating substrate 11x. The upper electrode 12a and the lower electrode 12b are electrically connected to the pads 13 (not shown in FIG. 7).

Herein, the pads 13 can be directly formed on the main surface 11s of the insulating substrate 11x, or can be formed on the main surface 11s of the insulating substrate 11x with another layer (for example, a low acoustic impedance layer 17s) interposed therebetween.

As described above, flux can be prevented from flowing into the hollow space 19 during mounting of the surface acoustic wave devices 10 and 10a by forming the protective layer 24 on the cover layer 22.

The present invention is not limited to the above-described preferred embodiments, and various modifications are possible.

For example, not only the SAW filter but also an element portion such as a SAW resonator can be formed on the piezoelectric substrate. Moreover, not only the BAW filter but also an element portion such as a BAW resonator can be formed on the insulating substrate.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An elastic wave device comprising:
   a substrate;
   a vibrating portion located on a first main surface of the substrate;
   a pad located on the first main surface of the substrate and electrically connected to an electrode of the vibrating portion;
   a supporting layer having a thickness larger than a thickness of the vibrating portion and arranged on the first main surface of the substrate so as to enclose the vibrating portion;
   a sheet-shaped cover layer composed of resin including synthetic rubber and arranged on the supporting layer so as to cover the vibrating portion and to define a hollow space around a periphery of the vibrating portion;
   a protective layer composed of resin having resistance to flux and arranged on a top surface of the cover layer remote from the supporting layer, the protective layer being disposed only on the top surface of the cover layer such that the protective layer does not contact the substrate;
   a via conductor extending through the protective layer, the cover layer, and the supporting layer and being connected to the pad; and
   an external electrode including a solder bump and located at an end of the via conductor adjacent to the protective layer.

2. The elastic wave device according to claim 1, wherein the substrate is a piezoelectric substrate, and the vibrating portion includes an IDT electrode.

3. The elastic wave device according to claim 1, wherein the substrate is an insulating substrate, and the vibrating portion includes a piezoelectric thin film including electrodes located on both sides thereof.

4. The elastic wave device according to claim 1, wherein the protective layer is composed of the same material as the supporting layer.

5. The elastic wave device according to claim 1, wherein the protective layer is composed of photosensitive polyimide resin.

6. The elastic wave device according to claim 1, wherein the cover layer is composed of non-photosensitive epoxy resin.

7. The elastic wave device according to claim 1, further comprising a nitride film or an oxide film at least partially interposed between the substrate and the supporting layer.

* * * * *